US 11,463,822 B2

(12) United States Patent
Knudsen

(10) Patent No.: US 11,463,822 B2
(45) Date of Patent: Oct. 4, 2022

(54) HEARING ASSISTIVE DEVICE WITH INCREASED DYNAMIC INPUT RANGE

(71) Applicant: Widex A/S, Lynge (DK)

(72) Inventor: Niels Ole Knudsen, Humlebaek (DK)

(73) Assignee: Widex A/S, Lynge (DK)

( * ) Notice: Subject to any disclaimer, the term of this patent is extended or adjusted under 35 U.S.C. 154(b) by 39 days.

(21) Appl. No.: 16/439,777

(22) Filed: Jun. 13, 2019

(65) Prior Publication Data
US 2019/0297432 A1 Sep. 26, 2019

Related U.S. Application Data

(63) Continuation of application No. PCT/EP2016/080925, filed on Dec. 14, 2016.

(51) Int. Cl.
*H04R 25/00* (2006.01)
*H03M 3/00* (2006.01)
(52) U.S. Cl.
CPC .......... *H04R 25/505* (2013.01); *H03M 3/368* (2013.01); *H03M 3/458* (2013.01); *H04R 25/453* (2013.01); *H04R 2225/33* (2013.01); *H04R 2225/43* (2013.01)
(58) Field of Classification Search
USPC ................................................ 381/312–331
See application file for complete search history.

(56) References Cited

U.S. PATENT DOCUMENTS

| 4,792,886 A | 12/1988 | Sahm |
| 5,280,235 A | 1/1994 | Neale et al. |
| 5,796,848 A * | 8/1998 | Martin ............... H04R 25/505 381/312 |
| 5,907,235 A | 5/1999 | Blumenkrantz et al. |
| 6,225,792 B1 | 5/2001 | Blumenkrantz et al. |
| 7,372,384 B1 | 5/2008 | Xu |
| 7,492,296 B1 | 2/2009 | Drakshapalli et al. |
| 8,125,362 B1 | 2/2012 | Bereza |

(Continued)

FOREIGN PATENT DOCUMENTS

EP  PCT/EP2016/080925   *  5/2019

OTHER PUBLICATIONS http://athena.ecs.csus.edu/~pheedley/ADC_team_docs/ADC2_refgen_arch_review.pdf.*

(Continued)

*Primary Examiner* — Suhan Ni
(74) *Attorney, Agent, or Firm* — Sughrue Mion, PLLC

(57) ABSTRACT

A hearing assistive device including an audio processing circuit with an analog-to-digital converter having an integrator integrating a voltage present in the summation point; a comparator comparing an output from the integrator with a reference voltage ($V_{ref}$) and outputting a logical level in accordance with the comparison; a feedback loop coupling a feedback signal back to the summation point; and a reference voltage generation circuit being adapted to provide the reference voltage ($V_{ref}$) being lower than a power supply voltage ($V_{battery}$) and following the decay of the power supply voltage ($V_{battery}$) with a predefined margin.

22 Claims, 2 Drawing Sheets

(56) References Cited

U.S. PATENT DOCUMENTS

| | | | |
|---|---|---|---|
| 8,436,620 B2* | 5/2013 | Stirk | G01R 19/2503 324/426 |
| 8,537,119 B1 | 9/2013 | Grivna et al. | |
| 9,780,801 B2 | 10/2017 | Heubi | |
| 2001/0005128 A1 | 6/2001 | Blumenkrantz et al. | |
| 2006/0050910 A1 | 3/2006 | Danielsen | |
| 2008/0106447 A1 | 5/2008 | Zare-Hoseini et al. | |
| 2012/0319880 A1 | 12/2012 | Matsumoto et al. | |
| 2013/0064407 A1 | 3/2013 | Hoevesteen | |
| 2013/0216076 A1* | 8/2013 | Knudsen | H04R 25/305 381/312 |
| 2013/0249726 A1 | 9/2013 | Knudsen | |
| 2014/0167991 A1 | 6/2014 | Oshita et al. | |
| 2014/0286061 A1* | 9/2014 | Inoue | H03K 17/0822 363/56.05 |
| 2015/0189448 A1 | 7/2015 | Siegumfeldt et al. | |
| 2015/0236592 A1* | 8/2015 | Inoue | H02P 29/68 318/445 |

OTHER PUBLICATIONS

R. Jacob Baker, "CMOS Circuit Design, Layout, and Simulation", Jan. 1, 2005, pp. 743-744, John Wiley & Sons, Inc.

Phillip E. Allen, et al., "CMOS Analog Circuit Design", Jan. 1, 2002, pp. 143-144, Oxford University Press.

Jerome Johnston, "A collection of bridge transducer digitizer circuits", Jan. 31, 1995, pp. 1-28, URL: http://www.cirrus.com/cn/pubs/appNote/an31.pdf.

Steven R. Norsworthy, et al., "Delta-sigma Data Converters", IEEE Circuits & Systems Society, Jan. 1, 1997, pp. 384-386.

Analog Devices, "High Precision 5 V Reference AD586", Mar. 1, 2005, pp. 1-17, URL: http://www.analog.com/media/en/technical-documentation/data-sheets/AD586.pdf.

R. P. Jindal, "Low-Pass Distributed RC Filter Using An MOS Transistor With Near Zero Phase Shift at High Frequencies", IEEE Transactions on Circuits and Systems, Aug. 1, 1989, pp. 1119-1123, vol. 36, No. 8.

International Search Report for PCT/EP2016/080925 dated Sep. 18, 2017 [PCT/ISA/210].

Jose R Custodio, et al: "A 1.2-V 165-µW 0.29-mm2 Multibit Sigma-Delta ADC for Hearing Aids Using Nonlinear DACs and With Over 91 dB Dynamic-Range", IEEE Transactions On Biomedical Circuits and Systems, vol. 7, No. 3, Jun. 2013, pp. 376-385.

\* cited by examiner

HEARING ASSISTIVE DEVICE WITH INCREASED DYNAMIC INPUT RANGE

RELATED APPLICATIONS

This application is a bypass continuation of international application No. PCT/EP2016/080925, filed on Dec. 14, 2016, in Europe and published as WO2018108260 A1, the disclosures of which are incorporated by reference in their entirety.

BACKGROUND OF THE INVENTION

1. Field of the Invention

The present invention relates to hearing assistive devices. The invention, more particularly, relates to a hearing assistive device with increased dynamic input range. Also, the invention relates to a voltage supply for an analog-to-digital converter.

When designing a hearing assistive device or a hearing aid, focus is on to increasing the dynamic input range. The dynamic input range is a prerequisite for ensuring a true reproduction of natural sounds. The presence of sounds exceeding the dynamic range of the input stage causes the signal to be clipped, which results in distorting harmonics present in the signal to be processed.

There is a need for providing excellent sound quality to users of hearing assistive devices or hearing aids even in very loud sound environments, e.g. loud music, parties, walking in busy city streets, etc.

SUMMARY OF THE INVENTION

The purpose of the invention is to provide a hearing assistive device or a hearing aid with increased dynamic input range ensuring the reproduction of natural sounds.

This purpose is according to the invention achieved by a hearing assistive device including an audio processing circuit. The audio processing circuit comprises an analog-to-digital converter having an integrator integrating a voltage present in a summation point; a comparator comparing a voltage output from the integrator with a reference voltage and outputting a logical level in accordance with the comparison; a feedback loop coupling a feedback signal back to the summation point; and a reference voltage generation circuit being adapted to provide the reference voltage at a level lower than that of a power supply voltage and following the decay of the power supply voltage with a predefined margin.

By letting the reference voltage depend of battery supply voltage rather than being fixed, the achievable dynamic range from a hearing can be increased. The increased dynamic range provides artifact-free sound processing even in even louder sound environments, and thereby improved speech intelligibility in loud sound environments.

According to a second aspect of the invention there is provided a reference voltage generation circuit for providing a reference voltage from a power supply, and comprising an electronic voltage amplifier (op-amp) coupled to the power supply via a passive circuit, and being adapted to control the reference voltage to be lower than the power supply voltage and follows the decay of the power supply voltage with a predefined margin.

According to a third aspect of the invention there is provided an audio processing circuit comprises an analog-to-digital converter having an integrator integrating a voltage present in a summation point, a comparator comparing an output from the integrator with a reference voltage and outputting a logical level in accordance with the comparison, a feedback loop coupling a feedback signal back to the summation point. The audio processing circuit further comprises a reference voltage generation circuit being adapted to provide the reference voltage being lower than a power supply voltage and following the decay of the power supply voltage with a predefined margin.

According to a fourth aspect of the invention there is provided a method for processing audio in a hearing assistive device, and comprising steps of converting an analog signal from a microphone in an analog-to-digital converter, generating a reference voltage from a power supply voltage, the reference voltage being lower than the power supply voltage, and following the decay of the power supply voltage with a predefined margin; and supplying the reference voltage to the analog-to-digital converter.

BRIEF DESCRIPTION OF THE DRAWINGS

The invention will be described in further detail with reference to preferred aspects and the accompanying drawing, in which.

DETAILED DESCRIPTION OF THE INVENTION

Figure 1:
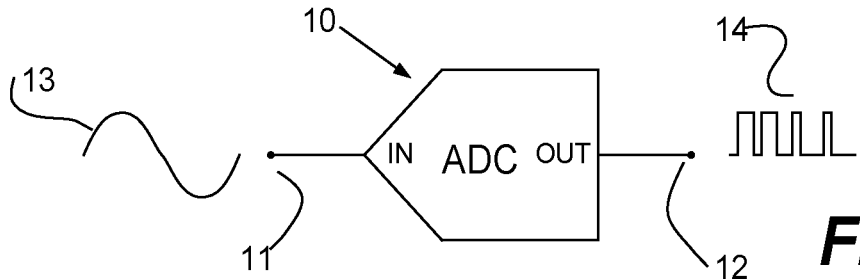
FIG. 1 illustrates schematically the operation of a delta sigma converter.

Reference is made to FIG. 1, which schematically illustrates a delta sigma converter 10 in which a reference voltage generation circuit according to one embodiment of the invention may implemented. The delta sigma converter 10 converts an analog voltage or analog signal 13 received on an input 11 into a digital representation 14 delivered on an output 12. The digital representation 14 is known as Pulse Density modulation or Pulse Frequency modulation. In general, frequency may vary smoothly in infinitesimal steps, as may voltage, and both may serve as an analog of an infinitesimally varying physical variable such as a speech signal or an acoustic signal. The substitution of frequency for voltage is thus entirely natural and carries in its train the transmission advantages of a pulse stream.

Most A/D converters, including the delta sigma converter 10, requires as input a reference voltage. The input voltage to the A/D converter is measured relative to this reference voltage. Hence, it is important that the reference voltage has sufficiently low noise.

The delta sigma converter 10 converts the mean of the analog voltage into the mean of the analog pulse frequency and counts the pulses in a known interval so that the pulse count divided by the interval gives an accurate digital representation of the mean analog voltage during the interval. This interval can be chosen to give any desired resolution or accuracy.

Figure 2:
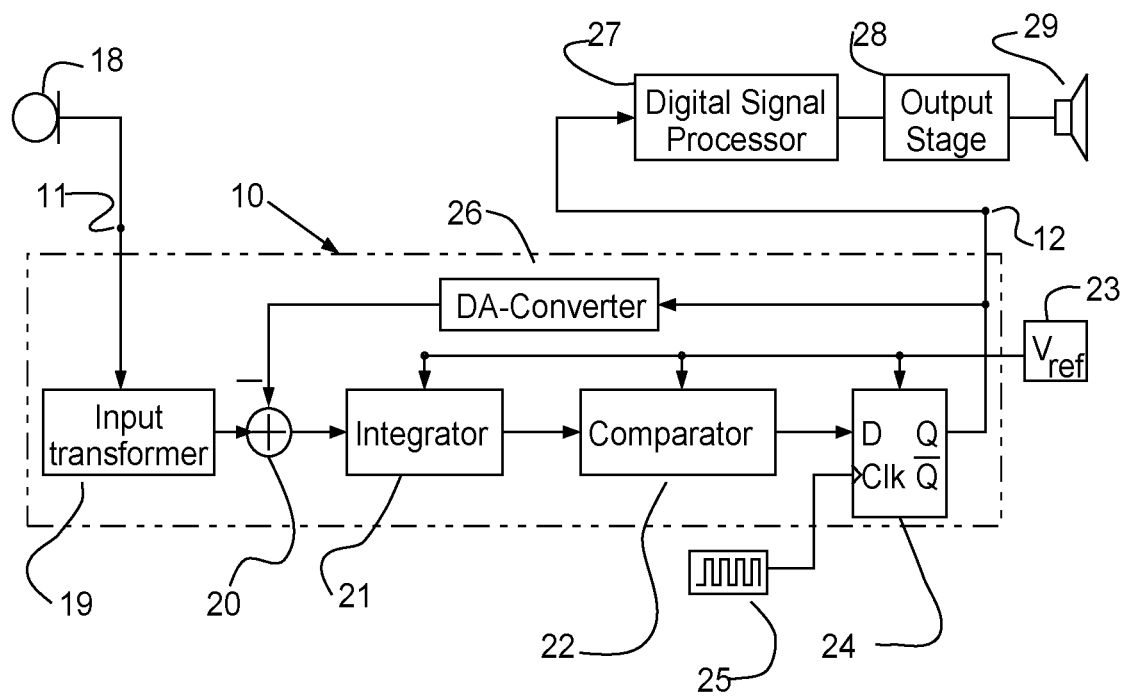
FIG. 2 illustrates schematically a hearing assistive device according to an embodiment of the invention.

FIG. 2 illustrates schematically a hearing assistive device according to an embodiment of the invention. The hearing assistive device includes an example of an A/D converter.

This converter is a 1-bit time-continuous delta sigma converter of first order, but the principles according to the invention applies to all converter types. The hearing assistive device may be a hearing aid.

The hearing assistive device has at least one input transducer or microphone 18 picking up an audio signal and transforming it into an electric representation, e.g. the analog signal 13. The delta sigma converter 10 receives the analog signal 13 at the input 11. In one embodiment of the invention, the delta sigma converter 10 comprises an input transformer 19 receiving the analog signal 13 and outputting a transformed voltage to a summation point 20. The input transformer 19 includes a switchable capacitor configuration which may be operated as described later with reference to FIG. 4.

A feedback voltage from a feedback loop is subtracted from the transformed voltage in the summation point 20, and the resulting signal is supplied to an integrator 21 performing a time integration of the signal voltage from the summation point 20. The integrator 21 will have a low pass filtering effect. The integral signal provided as the output from the integrator 21 will increase or decrease depending on whether the signal voltage from the summation point 20 is positive or negative.

The integral signal from the integrator 21 is presented to the input of a comparator 22 for generating a logical "1"-level whenever the integral signal exceeds a reference voltage $V_{ref}$ presented to the comparator 22, and a logical "0"-level whenever the integral signal from the integrator 21 is below the reference voltage $V_{ref}$. By using a battery supply dependent reference voltage, the dynamic range and clipping level in the A/D converter, the delta sigma converter 10, may become increased. With a suitable microphone 18 the hearing aid will be able to handle a larger dynamic range.

The reference voltage $V_{ref}$ is adapted to be lower than the power supply voltage provided by the battery voltage $V_{battery}$ and to follow the decay of the battery voltage $V_{battery}$ with a predefined margin. This predefined margin may in one embodiment be lower than 10% of the battery voltage $V_{battery}$. This predefined margin may in a further embodiment be lower than 5% of the battery voltage $V_{battery}$.

The binary output from the comparator 22 feeds the data input of a D flip-flop 24. The D flip-flop 24 captures the value of the D-input at a definite portion of the clock cycle, such as the rising edge of a clock signal. That captured value of the D-input becomes the Q output until the next definite portion of the clock cycle occurs and a new value of the D-input is captured and becomes the next Q output.

The clock frequency of the clock signal from a clock signal generator 25 defines the bit rate of the output signal 14 from the delta sigma converter 10. In the illustrated embodiment the clock frequency is stable in the range of 1-2 MHz. A charging and discharging period of the input transformer 19 may correspond to e.g. 64 clock cycles from the clock signal generator 25.

The bit stream from the flip-flop 24 is provided at the output 12 of the delta sigma converter 10 as a digital audio signal to a digital signal processor 27. The digital signal processor 27 is preferably a specialized microprocessor with its architecture optimized for the operational needs of digital signal processing, and in the illustrated embodiment the processor 27 is adapted for amplifying and conditioning of the audio signal intended to become presented for the hearing aid user. The amplification and conditioning is carried out according to a predetermined setting in order to alleviate a hearing loss by amplifying sound at frequencies in those parts of the audible frequency range where the user suffers a hearing deficit.

The processor 27 outputs according to one embodiment of the invention a digital signal fed to a digital output stage 28 and an output transducer or a speaker 29. The speaker 29 may be driven as a class D amplifier by the one-bit digital data stream received.

The output 12 of the delta sigma converter 10 is branched to provide a part of the data stream to a feedback loop. In the feedback loop, the part of the data stream is forwarded to a 1-bit D/A converter 26 converting the logical ones and zeroes in the part of the data stream into a positive or negative voltage with respect to the transformed voltage for subtraction from the transformed voltage in the summation point 20.

The gain in the A/D converter or the delta sigma converter 10 is inversely proportional to the reference voltage, $V_{ref}$. This is opposite to the output stage 28, which has a gain proportional to the reference voltage, $V_{ref}$. The entire hearing aid or hearing assistive device is neutral in relation to the reference voltage, $V_{ref}$, and we thereby obtain an additional advantage using a reference voltage, $V_{ref}$, following the decay of the power supply voltage $V_{battery}$ with a predefined margin.

Figure 3:
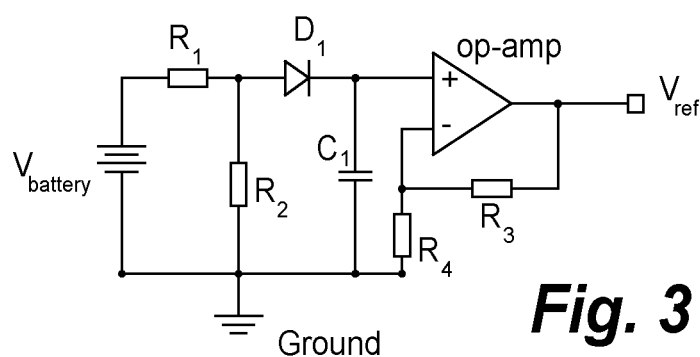
FIG. 3 illustrates an embodiment for a reference voltage generation circuit according to the invention.

An embodiment of the reference voltage generation circuit 23 is shown in FIG. 3. The reference voltage generation circuit 23 is adapted to provide a reference voltage $V_{ref}$ from a power supply $V_{battery}$, which may be hearing aid battery cell, e.g. of type 312 (discharge curve indicated in FIG. 5. The reference voltage generation circuit 23 comprises an electronic voltage amplifier or op-amp being coupled to the power supply $V_{battery}$ via a passive circuit. The electronic voltage amplifier (op-amp) outputs the reference voltage $V_{ref}$. The reference voltage generation circuit 23 is adapted to control the reference voltage $V_{ref}$ to be lower than the power supply $V_{battery}$ and to follow the decay of the power supply $V_{battery}$ with a predefined margin $\Delta V$.

The passive circuit of the reference voltage generation circuit 23 includes two resistors $R_1$ and $R_2$ providing a first voltage divider. The first voltage divider in the illustrated embodiment is a simple configuration with two resistors connected in series, with the input voltage $V_{battery}$ applied across the resistor pair and the output voltage emerging or being tapped from the connection between them. The output voltage from the first voltage divider is connected to a first input terminal of the electronic voltage amplifier via a low pass filter provided by a diode $D_1$ and a capacitor $C_1$. The low pass filter removes noise originating from the power supply, and prevents rapid changes of the voltage that would generate audible artifacts.

Two resistors $R_3$ and $R_4$ provide a simple configuration for the second voltage divider with the two resistors connected in series. The reference voltage $V_{ref}$ is applied across the resistor pair and the output voltage emerging from the connection between them. The output voltage from the second voltage divider is connected to a second input terminal of the electronic voltage amplifier. As the electronic voltage amplifier ensures that the voltage on its two input terminals are identical, the reference voltage $V_{ref}$ may be expressed as follows:

$$V_{ref}=V_{battery}*(1+R_3/R_4)/(1+R_1/R_2)$$

The reference voltage $V_{ref}$ must be less than the battery supply $V_{battery}$ so the gain must be configured so that $$(1+R_3/R_4)/(1+R_1/R_2)<1$$

Figure 4:
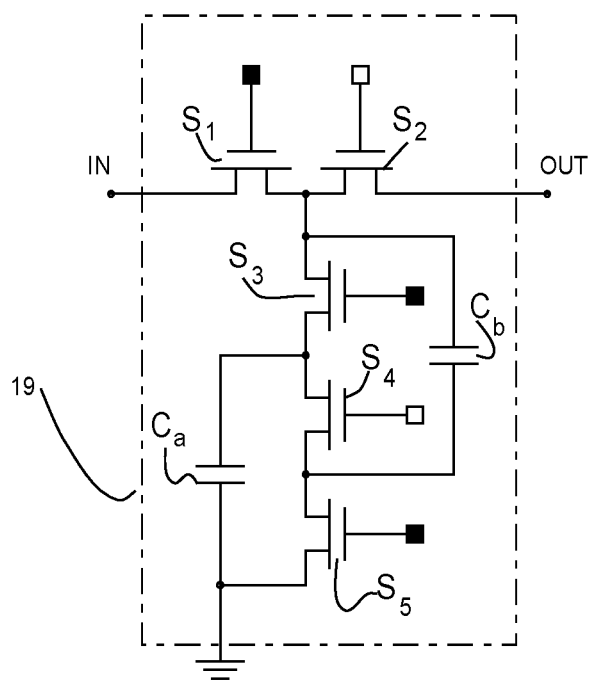
FIG. 4 illustrates an embodiment of an input transformer utilized according to certain aspects of the invention.

FIG. 4 shows how the input transformer 19 is operated in two phases; a charging phase and a discharging phase. In the charging phase, the analog signal 13 (see FIG. 1) is charging two capacitors, $C_a$ and $C_b$, arranged in parallel, while the same two capacitors, $C_a$ and $C_b$, are switched into series in the discharging phase and being connected to OUT or the summation point 20. The benefit by switching the capacitor coupling between parallel and series coupling is that the voltage supplied to the summation point 20 when switching to discharge phase is doubled and subsequently the discharging is twice as fast. This is beneficial as the relative noise voltage level is reduced without the need for increasing the supply current to the amplifier in the delta sigma converter 10.

Five switching transistor $S_1$-$S_5$ are controlled by a sampling clock signal (not shown) where the signal edge of the clock signal goes positive in the charging phase, the switching transistors $S_1$, $S_3$, and $S_5$ close, and $S_2$ and $S_4$ open. When the signal edge of the sampling clock signal goes negative in the discharging phase, the switching transistors $S_1$, $S_3$, and $S_5$ of the input transformer 19 open, and the switching transistors $S_2$ and $S_4$ close.

TABLE 1

| | $S_1, S_3, S_5$ | $S_2, S_4$ | |
|---|---|---|---|
| Charging phase | Closed | Open | $C_a$ and $C_b$ are connected in parallel |
| Discharging phase | Open | Closed | $C_a$ and $C_b$ are connected in series |

The filled and unfilled squares at the gate of the switching transistor $S_1$-$S_5$ indicate the operation of the switch. A filled square denotes a closed transistor switch in the charging phase and an open transistor switch in the discharging phase. An unfilled square denotes an open transistor switch in the charging phase and a closed transistor switch in the discharging phase.

The noise generated from the A/D converter or the delta sigma converter will be substantially independent of the reference voltage. The reason for this is that the inherent thermal noises from amplifiers etc. are the dominant noise sources independent of the reference voltage. In general, the A/D converter or the delta sigma converter will have benefits of having as high reference voltage as possible in order to increase the achievable dynamic range. Hereby the range for the input voltage for the converter increases, but the noise remains constant. For a hearing aid or a hearing assistive device this means that with a suitable microphone the hearing aid will be able to handle a larger dynamic range.

The reference voltage according to the invention may be used as supply not only for the A/D converter or the delta sigma converter. Similar to the A/D converter or the delta sigma converter, some microphone types applicable for use in the hearing aid or a hearing assistive device may benefit from an increased reference voltage for improving the dynamic range.

Figure 5:
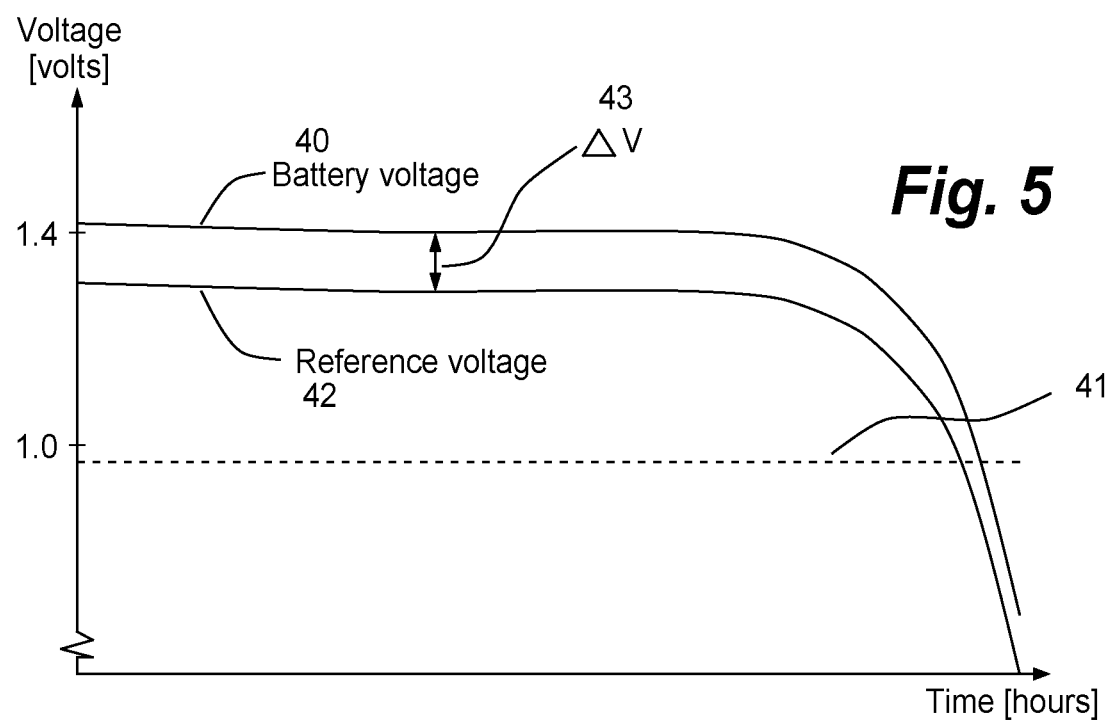
FIG. 5 illustrates the reference voltage relative to the battery voltage according to one aspect of the invention.

In order to generate a quiet and noise free reference voltage with adequate rejection of noise from the voltage supply (battery), the circuit that generates the reference voltage requires some voltage headroom. FIG. 5 illustrates (voltage versus time) how the voltage 40 from a hearing aid battery (type 312) varies during its lifetime. It typically starts out at a voltage up to 1.4 Volts, but the voltage can decrease to less than 1.0 volts before the battery is no longer able to power the hearing aid or the hearing assistive device. Therefore, the reference value has traditionally been decided to be fixed at a level just below the voltage at which the battery is no longer able to power the hearing aid or a hearing assistive device allowing at least 50 mV of voltage headroom for noise removal.

According to the invention, the reference voltage generation circuit is adapted to provide a reference voltage $V_{ref}$ which is lower than a power supply voltage $V_{battery}$ and following the decay of the power supply voltage $V_{battery}$ with a predefined margin. The reference voltage $V_{ref}$ is supplied to the A/D converters and microphones. This may increase the achievable dynamic range during most of the battery's lifetime.

The reference voltage generation circuit 23 according to one embodiment of the invention provides a reference voltage $V_{ref}$ from a power supply $V_{battery}$. The reference voltage generation circuit is adapted to control the reference voltage $V_{ref}$ (the curve 42) to be lower than the power supply $V_{battery}$ (the curve 40) and to follow the decay of the power supply $V_{battery}$ with a predefined margin $\Delta V$ (the difference 43). The level 41 is indicated on the figure as the level traditionally used to power the A/D converter and ensuring quiet and noise free reference voltage.

The invention claimed is:

1. A hearing assistive device including an audio processing circuit comprising:
   an analog-to-digital converter having
      an integrator integrating a voltage present at a summation point;
      a comparator comparing a voltage output from the integrator with a reference voltage ($V_{ref}$) and outputting a logical level in accordance with the comparison;
      a feedback loop coupling a feedback signal back to the summation point;
   a power supply providing a power supply voltage ($V_{battery}$) showing a decay during discharging; and
   a reference voltage generation circuit configured to provide the reference voltage ($V_{ref}$) at a voltage level lower than that of the power supply voltage ($V_{battery}$), the reference voltage following the decay of the power supply voltage ($V_{battery}$) with a predefined margin.

2. The hearing assistive device according to claim 1, wherein the reference voltage generation circuit comprises an electronic voltage amplifier (op-amp) coupled to the power supply ($V_{battery}$).

3. The hearing assistive device according to claim 2, wherein the reference voltage generation circuit includes a first voltage divider ($R_1$, $R_2$), wherein the power supply ($V_{battery}$) is input for the first voltage divider ($R_1$, $R_2$), and wherein the output from the first voltage divider ($R_1$, $R_2$) is connected to a first input terminal of the electronic voltage amplifier (op-amp).

4. The hearing assistive device according to claim 3, wherein the electronic voltage amplifier (op-amp) outputs the reference voltage ($V_{ref}$).

5. The hearing assistive device according to claim 3, wherein the output from the first voltage divider is connected to said first input terminal of the electronic voltage amplifier through a low pass filter.

6. The hearing assistive device according to claim 5, wherein the low pass filter comprises a rectifier passing said output from the first voltage divider to said first input terminal of the electronic voltage amplifier (op-amp).

7. The hearing assistive device according to claim 2, wherein a second voltage divider ($R_3$, $R_4$) receives the reference voltage ($V_{ref}$) as input, and wherein the output from the second voltage divider ($R_3$, $R_4$) is connected to a second input terminal of the electronic voltage amplifier (op-amp).

8. The hearing assistive device according to claim 1, wherein the reference voltage generation circuit includes a first voltage divider ($R_1$, $R_2$) and a second voltage divider ($R_3$, $R_4$), wherein the power supply voltage ($V_{battery}$) is input for the first voltage divider ($R_1$, $R_2$), and the reference voltage ($V_{ref}$) is input for the second voltage divider ($R_3$, $R_4$), and wherein the outputs from the first voltage divider ($R_1$, $R_2$) and the second voltage divider ($R_3$, $R_4$) are connected to respective input terminals on the electronic voltage amplifier (op-amp).

9. The hearing assistive device according to claim 8, wherein the output from the first voltage divider ($R_1$, $R_2$) is connected to the input terminal on the electronic voltage amplifier (op-amp) via a low pass filter ($D_1$, $C_1$).

10. The hearing assistive device according to claim 8, wherein the relationship between the reference voltage ($V_{ref}$) and power supply voltage ($V_{battery}$) is calculated from the equation:

$$Vref=Vbattery*(1+R_3/R_4)/(1+R_1/R_2).$$

11. The hearing assistive device according to claim 1, wherein a low pass filter ($D_1$, $C_1$) is arranged prior to an electronic voltage amplifier (op-amp) for removing noise from the power supply voltage ($V_{battery}$).

12. The hearing assistive device according to claim 11, wherein the electronic voltage amplifier (op-amp) is a DC-coupled high-gain electronic voltage amplifier with an input and a single-ended output presenting the reference voltage ($V_{ref}$).

13. The hearing assistive device according to claim 1, wherein the analog-to-digital converter is a delta sigma converter comprising:
an input transformer receiving an input voltage and outputting a transformed voltage to a summation point; and
wherein the input transformer includes a switchable capacitor configuration.

14. A reference voltage generation circuit for use in a hearing assistive device, for providing a reference voltage ($V_{ref}$) from a power supply voltage ($V_{battery}$) which shows a decay in voltage level during discharging, said reference voltage generation circuit comprising an electronic voltage amplifier (op-amp) coupled to the power supply voltage ($V_{battery}$) via a passive circuit, and being adapted to control the reference voltage ($V_{ref}$) to be lower than the power supply voltage ($V_{battery}$) and to follow the decay of the power supply voltage ($V_{battery}$) with a predefined margin.

15. The reference voltage generation circuit according to claim 14, wherein the passive circuit includes a first voltage divider ($R_1$, $R_2$), wherein the power supply voltage ($V_{battery}$) is input for the first voltage divider ($R_1$, $R_2$), and wherein the output from the first voltage divider ($R_1$, $R_2$) is connected to a first input terminal of the electronic voltage amplifier (op-amp).

16. The reference voltage generation circuit according to claim 15, wherein a second voltage divider ($R_3$, $R_4$) receives the reference voltage ($V_{ref}$) as input, and wherein the output from the second voltage divider ($R_3$, $R_4$) is connected to a second input terminal of the electronic voltage amplifier (op-amp).

17. The reference voltage generation circuit according to claim 14, wherein the passive circuit includes a first voltage divider ($R_1$, $R_2$) and a second voltage divider ($R_3$, $R_4$), where the power supply voltage ($V_{battery}$) is input for the first voltage divider ($R_1$, $R_2$), and the reference voltage ($V_{ref}$) is input for the second voltage divider ($R_3$, $R_4$), and wherein the outputs from the first voltage divider ($R_1$, $R_2$) and the second voltage divider ($R_3$, $R_4$) are connected to respective input terminals on the electronic voltage amplifier (op-amp).

18. The reference voltage generation circuit according to claim 17, wherein the output from the first voltage divider ($R_1$, $R_2$) is connected to the input terminal on the electronic voltage amplifier (op-amp) via a low pass filter ($D_1$, $C_1$).

19. The reference voltage generation circuit according to claim 17, wherein the relationship between the reference voltage ($V_{ref}$) and power supply voltage ($V_{battery}$) is calculated from the equation:

$$V_{ref}=V_{battery}*(1+R_3/R_4)/(1+R_1/R_2)$$

20. The reference voltage generation circuit according to claim 14, wherein the electronic voltage amplifier (op-amp) is a DC-coupled high-gain electronic voltage amplifier with a input and a single-ended output presenting the reference voltage ($V_{ref}$).

21. A method for processing audio in a hearing assistive device, said method comprising steps of:
converting an analog signal from a microphone in an analog-to-digital converter;
generating a reference voltage ($V_{ref}$) from a power supply voltage ($V_{battery}$), said power supply voltage showing a decay during discharging, the reference voltage ($V_{ref}$) being lower than the power supply voltage ($V_{battery}$), and following the decay of the power supply voltage ($V_{battery}$) with a predefined margin; and
supplying the reference voltage ($V_{ref}$) to the analog-to-digital converter.

22. The method according to claim 21, wherein the analog-to-digital converter is a delta sigma converter having a comparator, and comprising steps of:
comparing an output from an integrator with the reference voltage ($V_{ref}$), and
outputting a logical level in accordance with the comparison.

* * * * *